United States Patent
Chen et al.

(10) Patent No.: US 8,530,771 B2
(45) Date of Patent: Sep. 10, 2013

(54) SURFACE MOUNT PROCESS, SURFACE MOUNT SYSTEM, AND FEEDING APPARATUS THEREOF

(75) Inventors: Ji-Huei Chen, Zhubei (TW); Ming-Hua Tsai, Chiayi (TW); I-Chang Tsao, Hsinchu (TW); Jhih-Han Lin, Taipei (TW)

(73) Assignee: Lextar Electronics Corp., Hsinchu (TW)

( * ) Notice: Subject to any disclaimer, the term of this patent is extended or adjusted under 35 U.S.C. 154(b) by 191 days.

(21) Appl. No.: 13/010,505

(22) Filed: Jan. 20, 2011

(65) Prior Publication Data
US 2011/0315608 A1    Dec. 29, 2011

(30) Foreign Application Priority Data

Jun. 29, 2010 (TW) ................................ 99121193 A (51) Int. Cl.
*B07C 5/00* (2006.01)
(52) U.S. Cl.
USPC ............................................ 209/573; 29/740
(58) Field of Classification Search
USPC ...... 209/552, 571–573, 576, 644; 198/752.1, 198/756, 758; 29/739, 740
See application file for complete search history.

(56) References Cited

U.S. PATENT DOCUMENTS

| | | | | |
|---|---|---|---|---|
| 4,995,157 A | * | 2/1991 | Hall | 29/740 |
| 5,725,140 A | * | 3/1998 | Weber et al. | 226/139 |
| 5,755,548 A | * | 5/1998 | Gaasch et al. | 414/415 |
| 5,809,639 A | * | 9/1998 | Alvite | 29/740 |
| 6,152,283 A | * | 11/2000 | Kondo et al. | 198/396 |
| 7,553,110 B2 | * | 6/2009 | Minami et al. | 406/75 |
| 8,251,204 B1 | * | 8/2012 | Mazza et al. | 198/769 |
| 8,302,290 B2 | * | 11/2012 | Park et al. | 29/739 |

FOREIGN PATENT DOCUMENTS

| | | |
|---|---|---|
| JP | 2002-084095 (A) | 3/2003 |
| JP | 2005-233730 (A) | 9/2005 |
| KR | 10-2003-0062203 | 7/2003 |
| TW | 419111 | 1/2001 |
| TW | M330974 | 4/2008 |
| TW | M332670 | 5/2008 |
| TW | M332671 | 5/2008 |
| TW | M333402 | 6/2008 |
| TW | M333403 | 6/2008 |
| TW | M335500 | 7/2008 |
| TW | M372346 | 1/2010 |
| TW | 201132571 | 10/2011 |

* cited by examiner

*Primary Examiner* — Joseph C Rodriguez
(74) *Attorney, Agent, or Firm* — Muncy, Geissler, Olds & Lowe, PLLC (57) ABSTRACT

A surface mount process, a surface mount system, and a feeding apparatus thereof are provided. The surface mount system includes a feeding apparatus and a surface mount apparatus. The feeding apparatus includes a vibrating tray feeder module, a vibrating linear feeder module, and a component recycling module. The vibrating tray feeder module has a circular vibrating conveyer belt with a vibrating tray output end. The vibrating linear feeder module has a linear vibrating conveyer belt connected to the vibrating tray output end and has a linear vibrating output end opposite the vibrating tray feeder module. The component recycling module is disposed under the vibrating tray feeder module to recycle the rejected components. The surface mount apparatus has a component receiving unit corresponding to the linear vibrating output end of the vibrating linear feeder module.

20 Claims, 8 Drawing Sheets

SURFACE MOUNT PROCESS, SURFACE MOUNT SYSTEM, AND FEEDING APPARATUS THEREOF

This application claims priority based on a Taiwanese Patent Application No. 099121193, filed on Jun. 29, 2010, the disclosure of which is incorporated herein by reference in its entirety.

BACKGROUND OF THE INVENTION

1. Field of the Invention

The present invention relates to a surface mount process, a surface mount system, and a feeding apparatus thereof. Particularly, the present invention relates to a surface mount process, a surface mount system, and a feeding apparatus utilized in the surface mount process.

2. Description of the Related Art

SMT (surface mount technology) is a type of manufacturing process for fixing electronic components onto the surface of printed circuit boards (PCBs). Surface mount technologies have properties that include having high component density, high reliability, strong anti-vibration, preferable characteristics in high frequency, and being automation friendly. Surface mount technology is a substitute for traditional through hole technology (THT), and the manufacturing processes of through hole technology are consequently being replaced by surface-mount technology manufacturing processes as surface-mount technologies are more gradually extensively employed in the manufacturing processes of electronic products. The supplying of components occurs at the front-end manufacturing in the SMT manufacturing process and is a core factor that greatly affects the manufacturing yield, the production time, and the manufacturing cost. Conventional methods entail first packaging the scattered electronic components into a tape reel or a tray, and then supplying the packaged component to a surface mount apparatus.

Figure 1:
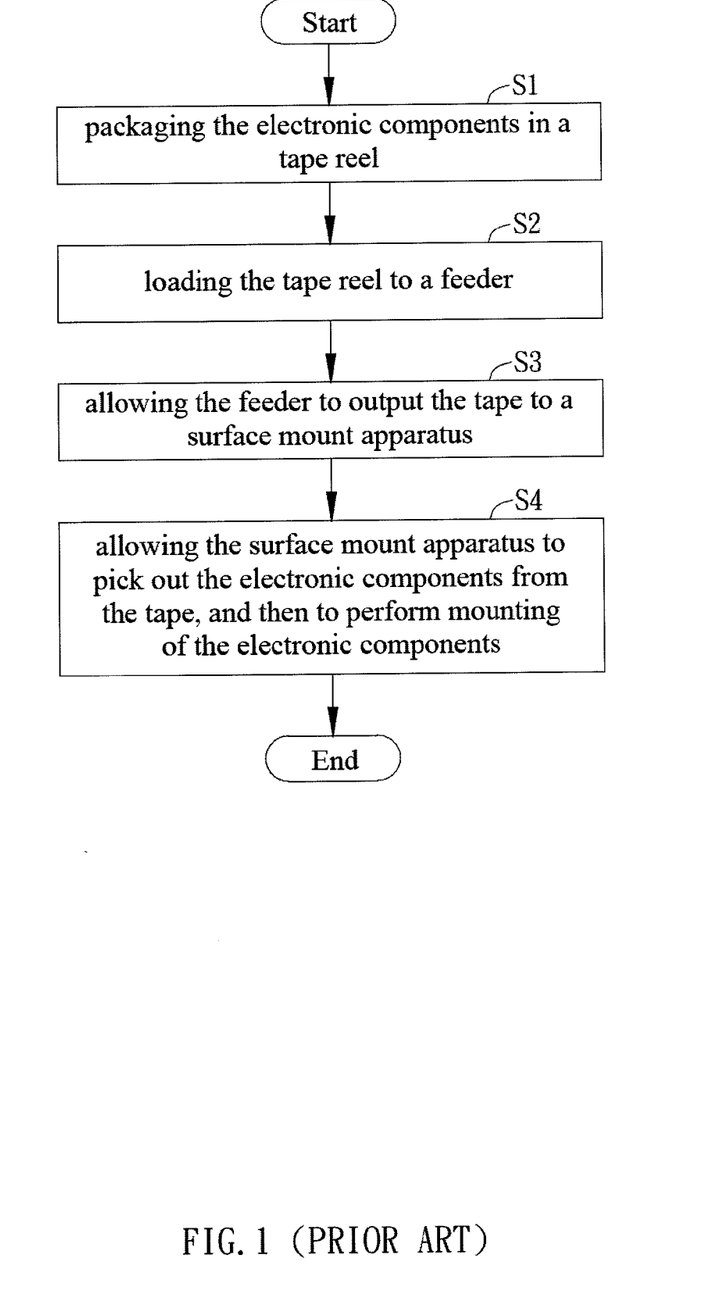
FIG. 1 is a flow chart of a conventional component-mounting process.

FIG. 1 is a flow chart of a conventional component mounting process. As shown in FIG. 1, step 1 includes packaging the electronic components in a tape reel. The scattered electronic components can be independently placed and predeterminedly gapped on a long tape, and then reeled into a roll—much like the magnetic strip of a cassette player gets reeled up into a roll—for easier loading and transporting. Step 2 includes loading the tape reel to a feeder. Step 3 includes allowing the feeder to output the tape to a surface mount apparatus. The curved tape is inputted after expansion to the surface mount apparatus at a predetermined speed. Step 4 includes allowing the surface mount apparatus to pick out the electronic components from the tape, and then to perform mounting of the electronic components. The electronic components on the tape are picked up through suction or any other viable methods, and then mounted to a circuit board with tin paste or other materials.

However, on one hand the tape and reel packaging of the components demands additional costs for the packaging material, on the other hand also requires additional packaging time. Moreover, the propensity for failure to occur during the surface mounting process, such as failure of the suction nozzles or identification of components during the pick-and-place process, remains high and the surface mount apparatus will consequently fail to mount the components onto the printed circuit board. At this point in time, the components may either be remounted by performing steps 1 to 4 once again or remounted using manual labor. The opportunity cost of utilizing the former method is additional time and costs required to remount one component while the opportunity cost of the latter method is higher defective rates.

SUMMARY OF THE INVENTION

It is an object of the present invention to provide a surface mount process. In comparison to the prior arts, there are time and cost savings to feeding scattered components directly into the feeder instead of first packaging the components in a tape reel. Additionally, the time and cost to remount components can also be saved.

It is another object of the present invention to provide a surface mount system. In comparison to the prior arts, the cost of tape reels and tape reel equipments can be saved.

It is yet another object of the present invention to provide a feeding apparatus. In comparison to the prior arts, scattered components can be fed directly into the feeder, wherein the feeder possesses the ability to recycle components to provide components once again.

The surface mount system of the present invention includes a feeding apparatus and a surface mount apparatus. The feeding apparatus includes a vibrating tray feeder module, a vibrating linear feeder module, and a component recycling module. The vibrating tray feeder module has a circular vibrating conveyer belt with a vibrating tray output end. The vibrating linear feeder module has a linear vibrating conveyer belt connected to the vibrating tray output end, and has a linear vibrating output end opposite the vibrating tray feeder module. The component recycling module is disposed under the vibrating tray feeder module in order to recycle components rejected by the vibrating tray feeder module. The surface mount apparatus has a component receiving unit corresponding to the linear vibrating output end of the vibrating linear feeder module. The surface mount system allows the feeding apparatus to feed scattered components into the surface mount apparatus while also allowing the component recycling module to recycle components rejected by the feeding apparatus.

The surface mounting method of the present invention is applicable to performing a surface mount process on a plurality of components, and includes the following steps. A plurality of components are transported by vibration from the vibrating tray feeder module to the vibrating tray output end. The vibrating linear feeder module then receives the plurality of components from the vibrating tray output end, delivering them to the linear vibrating output end opposite the vibrating tray output end. The linear vibrating output end is aligned to a component receiving unit of the surface mount apparatus in order for the component receiving unit to receive the components from the linear vibrating output end. The surface mount process then directly feeds the scattered components to the surface mount apparatus without the need to package the components in advance.

DETAILED DESCRIPTION OF THE PREFERRED EMBODIMENT

The present invention provides a surface mount process, a surface mount system, and a feeding apparatus thereof. In the preferred embodiment, the surface mount process can complement the SMT manufacturing processes while the surface mount system and the feeding apparatus may be used in other manufacturing processes.

The preferred embodiment of the present invention is illustrated in FIGS. 2-5. FIG. 2A is a schematic view of an embodiment of the surface mount system of the present invention. FIG. 2B is a side view of the surface mount system shown in FIG. 2A. FIG. 2C is an exploded view of the surface mount system shown in FIG. 2B. As shown in FIGS. 2A, 2B, and 2C, the surface mount system includes a feeding apparatus 10 and a surface mount apparatus 20. The feeding apparatus 10 is disposed to one side of the surface mount apparatus 20 and feeds components to the surface mount apparatus 20. The component to be fed preferably consist of kernels of electronics, such as light-emitting diodes (LED), although many other types of components are still allowable.

Figure 2A:
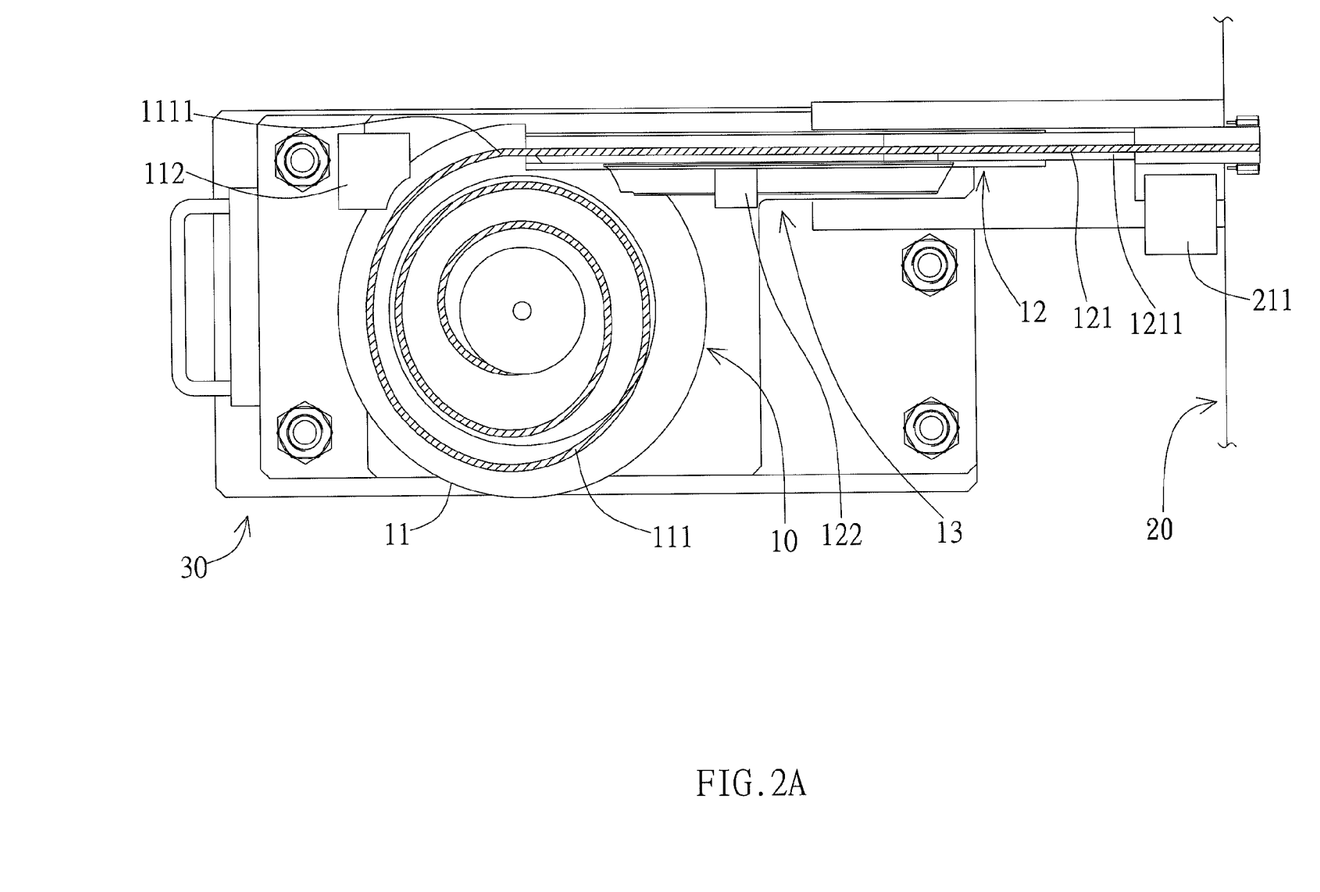
FIG. 2A is a schematic view of an embodiment of the surface mount system of the present invention.
Figure 2B:
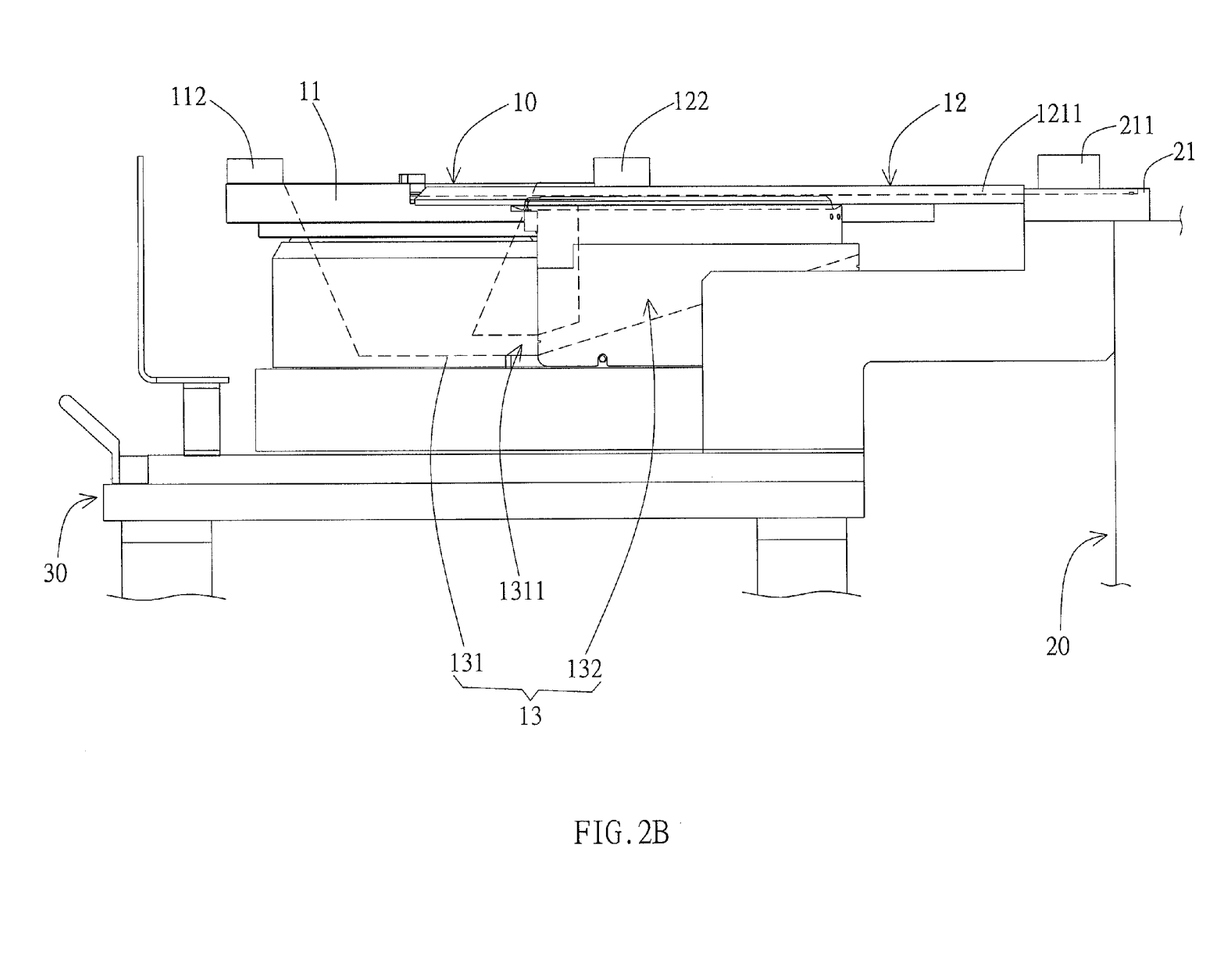
FIG. 2B is a side view of the surface mount system shown in FIG. 2A.
Figure 2C:
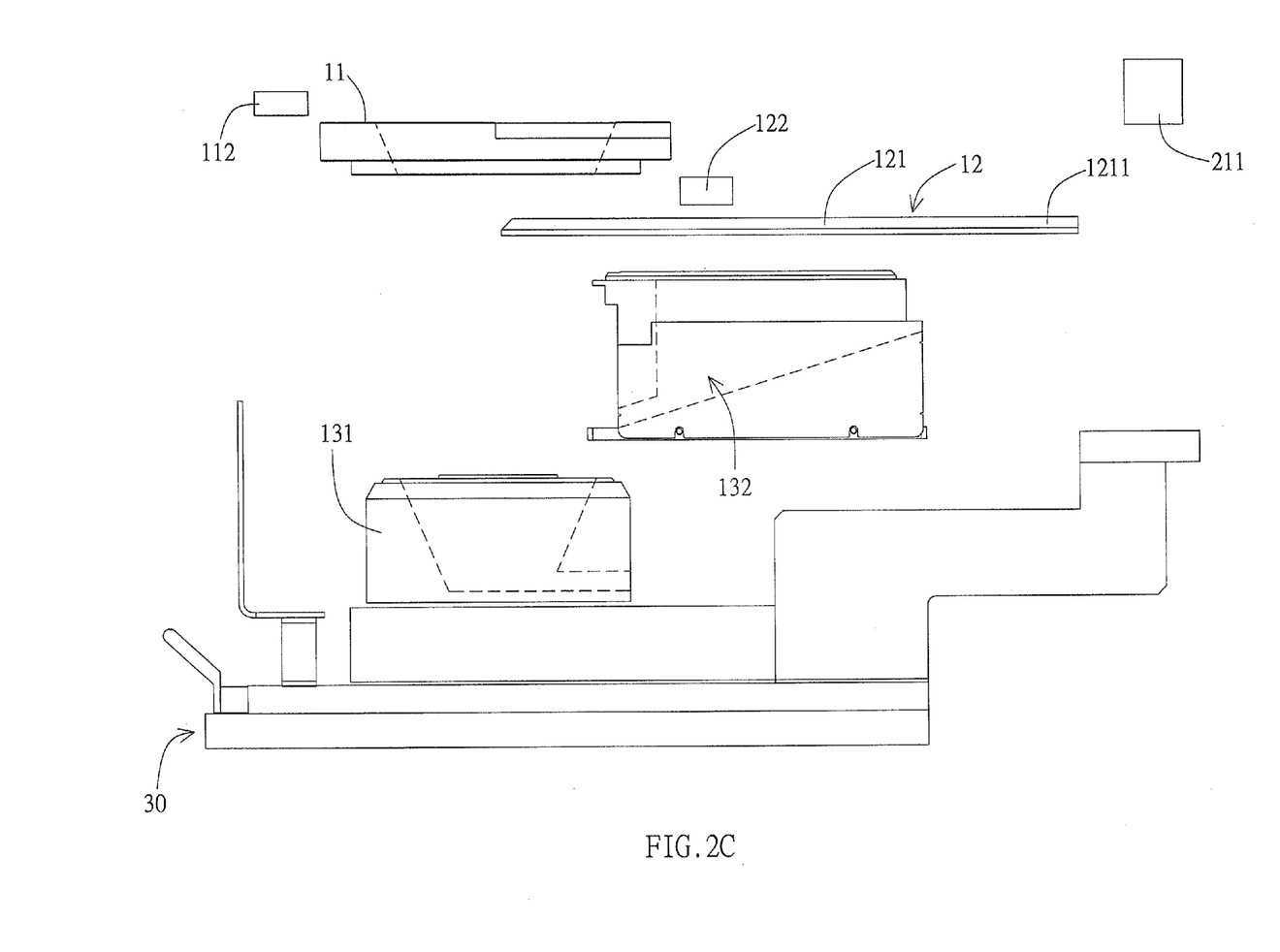
FIG. 2C is an exploded view of the surface mount system shown in FIG. 2B.

The feeding apparatus 10 includes a vibrating tray feeder module 11, a vibrating linear feeder module 12, and a component recycling module 13. The vibrating tray feeder module 11 has a circular vibrating conveyer belt 111 and a first sifting unit 112. The circular vibrating conveyer belt 111 has a vibrating tray output end 1111 connected to the vibrating linear feeder module 12. The components placed in the feeding apparatus 10 are transported by vibration along the circular vibrating conveyer belt 111 to the vibrating tray output end 1111. In order for the components of the present embodiment to have the correct polarity during the mounting process, the components are fed into the surface mount apparatus 20 with a given polarity. The first sifting unit 112 is disposed on the circular vibrating conveyer belt 111, located on the upstream of the vibrating tray output end 1111 (i.e., portions of the circular vibrating conveyer belt 111 non inclusive of the vibrating tray output end 1111) so that sifting of the components may be performed by the first sifting unit 112 before the components enter the vibrating tray output end 1111. In the preferred embodiment, the first sifting unit 112 blows components off the circular vibrating conveyer belt 111 by pressurized air. The rejected components are then recycled through the component recycling module 13. Moreover, the first sifting unit 112 may also include a photoelectric sensor, an image identifying apparatus, or any other image sensitive devices capable of identifying component positions. With the additional image detection device, the first sifting unit 112 can determine the polarity positions of the components by analyzing the imagery differences in component positions. The unit quantity of the first sifting unit 112 may be increased or decreased as required, and may even be omitted or disposed at other alternative locations accordingly to the requirements.

The vibrating linear feeder module 12 has a linear vibrating conveyer belt 121. One end of the linear vibrating conveyer belt 121 is connected to the vibrating tray output end 1111 to receive components from the circular vibrating conveyer belt 111, while the other end is a linear vibrating output end 1211 that corresponds to the component receiving unit 21 of the surface mount apparatus 20. In the present embodiment, a second sifting unit 122 is disposed on the linear vibrating conveyer belt 121, located in the vicinity of the vibrating tray output end 1111. After the first sifting unit 112 checks the components, the second sifting unit 122 again checks the same components in order to assure the components are in the correct polarity positions. In the preferred embodiment, the second sifting unit 122 utilizes pressurized air to blow any rejected components off the linear vibrating conveyer belt 121 for the component recycling module 13 to collect and recycle. Moreover, the second sifting unit 122 also may include a photoelectric sensor, an image identifying apparatus, or any other image sensitive devices capable of identifying component positions. With the additional image detection device, the second sifting unit 122 can determine the polarity positions of the components by analyzing the imagery differences in component positions. The unit quantity of the second sifting unit 122 may be increased or decreased as required, and may even be omitted or disposed at other alternative locations. Summarily, the feeding apparatus 10 is capable of feeding the scattered components directly into the surface mount apparatus 20. In comparison to the prior arts, the cost of tape reels, tape reel equipments, as well as the cost and time to prepackage the components in a tape reel can be saved.

Figure 2D:
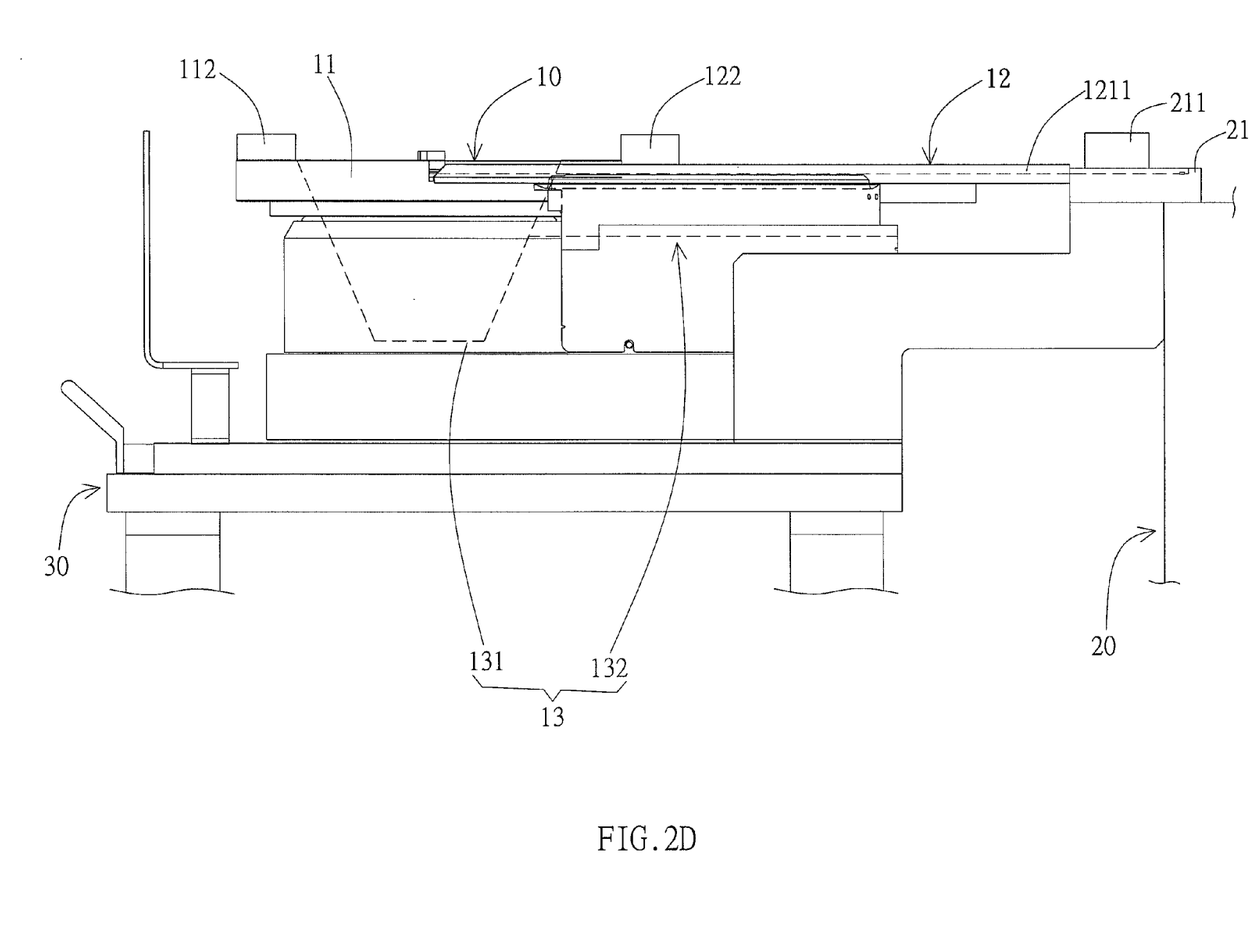
FIG. 2D is a schematic view of another embodiment of the component guiding channel of the surface mount system shown in FIG. 2A.

The component recycling module 13 includes a recycling chamber 131 and a component guiding channel 132. The recycling chamber 131 is disposed under the vibrating tray feeder module 11, while the component guiding channel 132 extends underneath the second sifting unit 122 in order to deliver rejected components from the second sifting unit 122 to the recycling chamber 131. The bottom of the recycling chamber 131 preferably includes a component through-hole 1311 to communicate with the component guiding channel 132. The components falling into the component guiding channel 132 will be delivered to the recycling chamber 131, and the components in the recycling chamber 131 will be delivered by the circular vibrating conveyer belt 111 upwards again, so as to perform the above-mentioned component delivering process. In the present embodiment, the component guiding channel 132 is a slide inclining towards the recycling chamber 131 so that the components thereon can slide toward the recycling chamber 131. However, in alternative embodiments, other non-inclined designs may be adopted. As shown in FIG. 2D, the component guiding channel 132, disposed in the horizontal plane, transports the components by vibration to the recycling chamber 131. A blow apparatus may be disposed beside the component guiding channel 132 to blow components by pressurized air to the recycling chamber 131. The circular vibrating conveyer belt 111 extends upwardly from the bottom of the recycling chamber 131 along a spiral path, allowing the components at the bottom of the recycling chamber 131 to move upwards along the circular vibrating conveyer belt 111. In short, the recycling module 13 delivers rejected components back to the vibrating tray feeder module 11 in order for the feeder to provide components once again. In comparison to the prior arts, the time and cost to package and remount rejected components can be saved.

The component receiving unit 21 of the surface mount apparatus 20 receives the components from the linear vibrating output end 1211. The component receiving unit 21 preferably is a mechanical arm with a suction mechanism that grips components through suction, although other apparatuses capable of receiving components are also acceptable.

Figure 3:
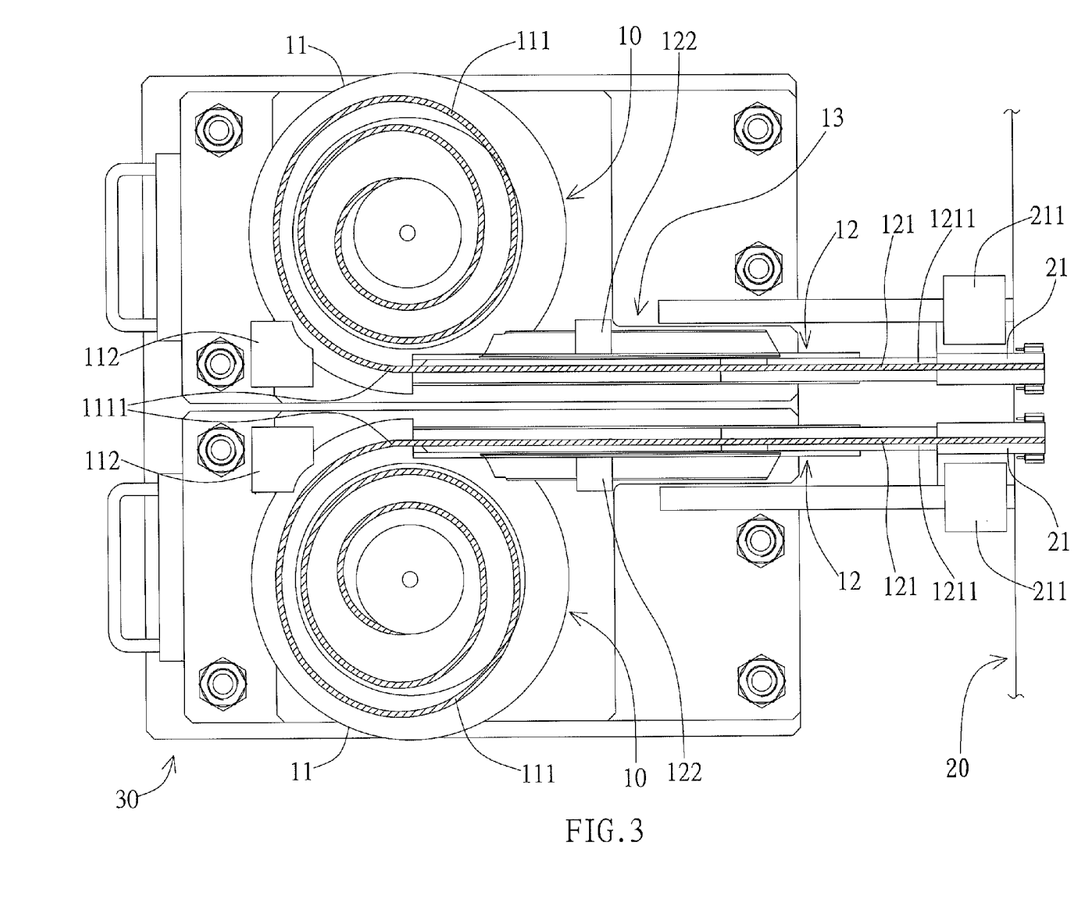
FIG. 3 is a schematic view of an embodiment of using a plurality of feeding apparatus in the surface mount system of the present invention.

After successfully receiving the components, the components are mounted by the other portions of the surface mount apparatus 20. In the present embodiment, the component receiving unit 21 periodically receives components at predetermined intervals of time from the linear vibrating output end 1211. In order to ensure the successful receiving of the component receiving unit 21, a feeding speed $S_1$ of the linear vibrating conveyer belt 121 can be set to be greater than a receiving speed $S_2$ of the component receiving unit 21. However, in alternative embodiments, when the feeding speed $S_1$ of the linear vibrating conveyer belt 121 is smaller than the receiving speed $S_2$ of the component receiving unit 21, the number of the feeding apparatus 10 can be increased to match the receiving speed $S_2$ of the component receiving unit 21 (i.e. enabling the sum of the feeding speed $S_1$ of the feeding apparatus 10 to be greater than the receiving speed $S_2$ of the component receiving unit 21). As shown in FIG. 3, two feeding apparatuses 10 are disposed side-by-side, and simultaneously feed components to the surface mount apparatus 20. Moreover in other embodiments, a detector 211 may be disposed on the component receiving unit 21 in order to detect the transport status of the components on the linear vibrating output end 1211. If there is any component at the linear vibrating output end 1211, the component receiving unit 21 is actuated to receive the component from the linear vibrating output end 1211. The detector may be a vacuum sensing system, a photoelectric sensing system, or any other apparatus capable of detecting the presence of the components. The utilization of the detector enhances the success rate of the component receiving unit 21 in receiving the components, and consequently increases the production speed as a result.

Figure 4:
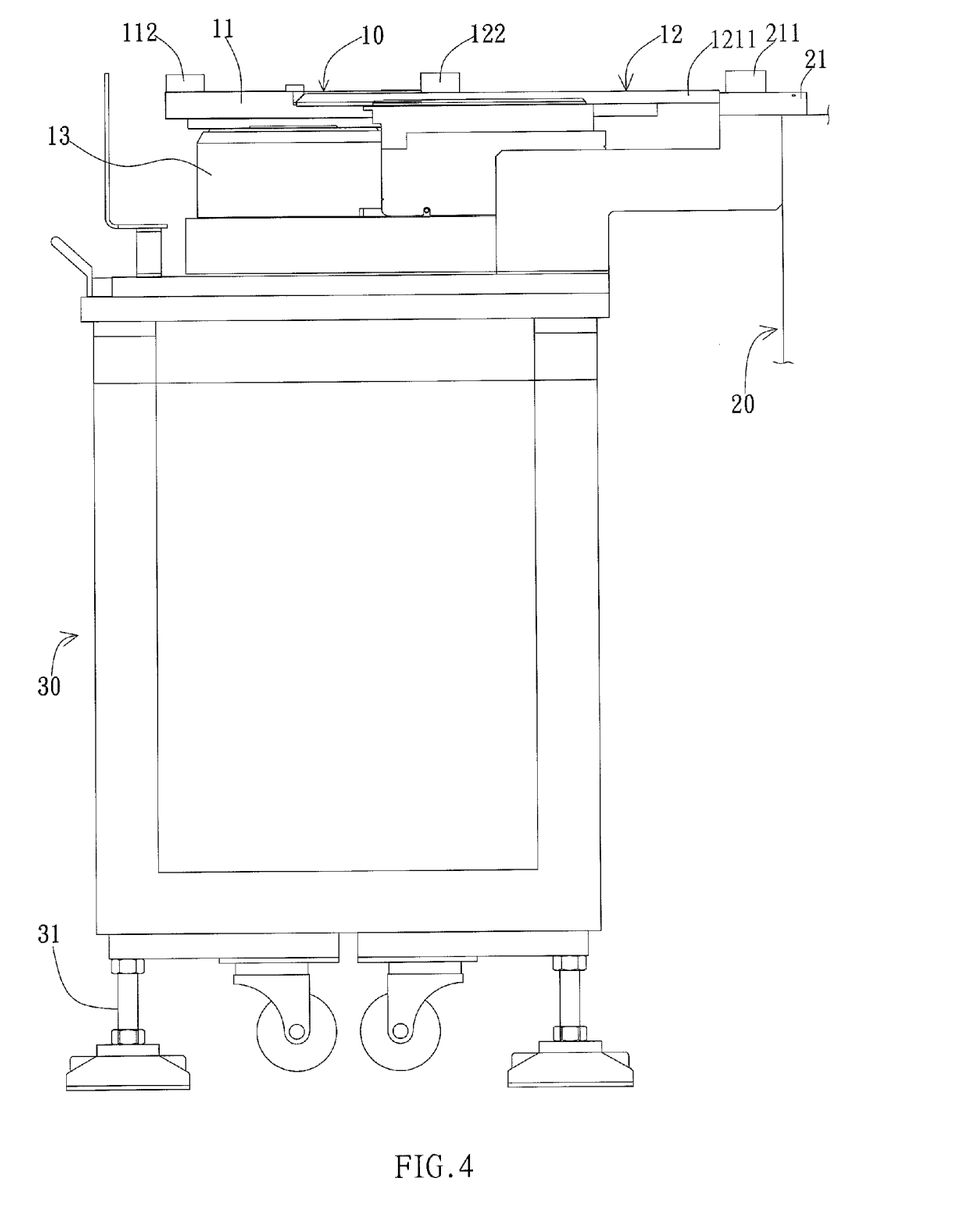
FIG. 4 is a schematic view of an embodiment of disposing the surface mounting system of the present invention on a base.

FIG. 4 is a schematic view of an embodiment of disposing the surface mount system on a base. As shown in FIG. 4, the entirety of the feeding apparatus 10, including the vibrating tray feeder module 11, the vibrating linear feeder module 12, and the recycling module 13, is supported by a base 30 that is height adjustable. In the present embodiment, the supporting legs 31 of the base 30 can be adjusted so that the height of the linear vibrating output end 1211 of the feeding apparatus 10 corresponds to the height of the component receiving unit 21 of the surface mount apparatus 20. The component receiving unit 21 can then receive the components from the linear vibrating output end 1211.

Figure 5:
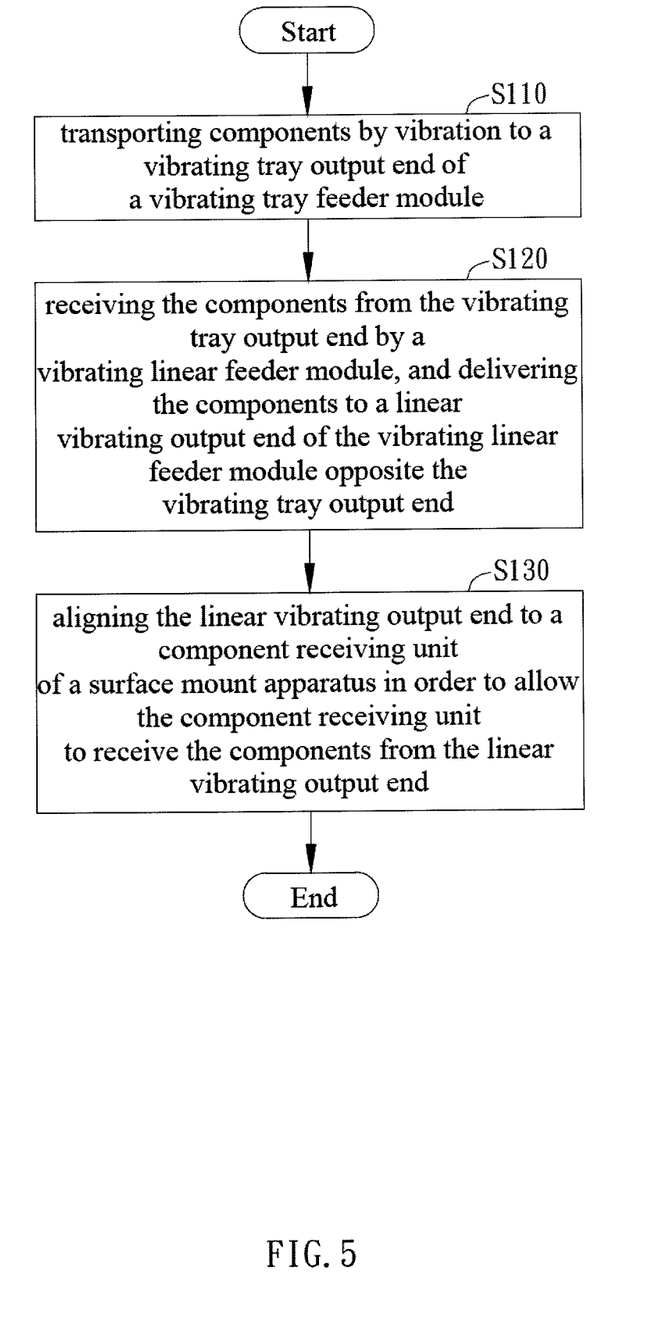
FIG. 5 is a flow chart of an embodiment of the surface mount process of the present invention.

FIG. 5 is a flow chart of an embodiment of the surface mount process of the present invention. The surface mount process is preferably utilized to perform a surface mount process on kernels of electronic components, although many other types of components are also applicable. As shown in FIG. 5, step 110 includes transporting the components by vibration to the vibrating tray output end of the vibrating tray feeder module. In the present embodiment, the components are required to be positioned in a specific polarity before being fed into the vibrating tray feeder module for mounting. Step 110 includes sifting the components in the vibrating tray feeder module by the first sifting unit, and recycling rejected components with recycling module. Moreover, the first sifting unit may include a photoelectric sensor, an image identifying apparatus, or any other image sensitive devices capable of identifying component positions. With the additional image detection device, the first sifting unit can determine the polarity positions of the components by analyzing the imagery differences in component positions. In addition, in a preferred embodiment, the first sifting unit in the preferred embodiment blows the components with pressurized air off the circular vibrating conveyer belt.

Step 120 includes receiving the components from the vibrating tray output end by a vibrating linear feeder module, and delivering the components to a linear vibrating output end of the vibrating linear feeder module opposite the vibrating tray output end. In the preferred embodiment, step 120 can include sifting the components from the vibrating linear feeder module with the second sifting unit, and then utilizing the component recycling module to recycle the components rejected by the second sifting unit. After the first sifting unit checks the components, the second sifting unit again checks the same components in order to assure the components are in the correct polarity positions. In addition, in a preferred embodiment, the second sifting unit blows the rejected components off the vibrating linear feeder module with pressurized air. The second sifting unit may include a photoelectric sensor, an image identifying apparatus, or any other image sensitive devices capable of identifying component positions. With the additional image detection device, the second sifting unit can determine the polarity positions of the components by analyzing the imagery differences in component positions. The recycling module includes a recycling chamber and a component guiding channel. The recycling chamber is disposed under the vibrating tray feeder module while the component guiding channel extends underneath the second sifting unit to the recycling chamber in order to collect the components rejected by the second sifting unit for recycling. The bottom of the recycling chamber has a component throughhole to communicate with the component guiding channel in order to deliver the recycled components to the recycling chamber. The components in the recycling chamber will be delivered upwardly by the vibrating tray feeder module in order to perform the component delivering process outlined in step 110. In short, the component recycling module delivers the rejected components to the vibrating tray feeder module. In comparison to the previously mentioned prior arts, the time and cost to prepackage the components as well as the cost to remount the rejected components can be saved.

Step 130 includes aligning the linear vibrating output end to a component receiving unit of a surface mount apparatus in order to allow the component receiving unit to receive the components from the linear vibrating output end. The component receiving unit is preferably a mechanical arm with a suction mechanism that grips components through suction, although any other apparatus capable of receiving components is also acceptable. After successfully receiving the components, the components are mounted by the other portions of the surface mount apparatus. In the present embodiment, the entirety of the feeding apparatus including the vibrating tray feeder module, the vibrating linear feeder module, and the component recycling module is supported by a base that is height adjustable. Hence, step 130 can include adjusting the height of the base supporting the vibrating tray feeder module and the vibrating linear feeder module, so that the height of the linear vibrating output end corresponds to the height of the component receiving unit of the surface mount apparatus. The component receiving unit can then receive the components from the linear vibrating output end. To sum up, the vibrating linear feeder module directly feeds the scattered components to the component receiving unit. In comparison to the prior arts, the time and the cost to prepackage the components in a tape reel can be saved.

The component receiving unit of the surface mount apparatus receives the components from the linear vibrating conveyer belt. The component receiving unit preferably is a mechanical arm with a suction mechanism that grips components through suction, although other apparatuses capable of receiving components are also acceptable. After successfully receiving the components, the components are mounted by the other portions of the surface mount apparatus. In the present embodiment, the component receiving unit periodically receives components at predetermined intervals of time from the linear vibrating conveyer belt. In order to ensure the successful receiving of the component receiving unit, a feeding speed of the linear vibrating conveyer belt can be set to be greater than a receiving speed of the component receiving unit. However, in alternative embodiments, when the feeding speed of the linear vibrating conveyer belt is smaller than the receiving speed of the component receiving unit, the number of the feeding apparatuses can be increased to match the receiving speed of the component receiving unit (i.e. enabling the sum of the feeding speed of the feeding apparatuses to be greater than the receiving speed of the component receiving unit). For example, two feeding apparatuses can be disposed side-by-side and simultaneously feed components to the surface mount apparatus. Moreover in other embodiments, a detector may be disposed on the component receiving unit in order to detect the transport status of the components on the linear vibrating output end. If there is any component at the linear vibrating output end, the component receiving unit is actuated to receive the component from the linear vibrating output end. The detector may be a vacuum sensing system, a photoelectric sensing system, or any other apparatus capable of detecting the presence of the components. The utilization of the detector enhances the success rate of the component receiving unit in receiving the components, and consequently increases the production speed as a result.

Although the preferred embodiments of the present invention have been described herein, the above description is merely illustrative. Further modification of the invention herein disclosed will occur to those skilled in the respective arts and all such modifications are deemed to be within the scope of the invention as defined by the appended claims.

What is claimed is:

1. A feeding apparatus for delivering a plurality of components to a surface mount device, comprising:
    a vibrating tray feeder module having a circular vibrating conveyer belt and at least a first sifting unit, wherein the circular vibrating conveyer belt has a vibrating tray output end, the first sifting unit is disposed on the circular vibrating conveyer belt and is located at upstream of the vibrating tray output end;
    a vibrating linear feeder module having a linear vibrating conveyer belt and at least a second sifting unit, wherein the linear vibrating conveyer belt is connected to the vibrating tray output end of the circular vibrating conveyer belt, the second sifting unit is disposed on the linear vibrating conveyer belt and is located near the vibrating tray output end; and
    a component recycling module disposed under the vibrating tray feeder module, partially extending underneath the second sifting unit, wherein the component recycling module recycles a portion of the components rejected by the first sifting unit and the second sifting unit.

2. The feeding apparatus of claim 1, wherein the component recycling module further comprises a recycling chamber and a component guiding channel, the recycling chamber is disposed under the vibrating tray feeder module while the component guiding channel extends underneath the second sifting unit and delivers the components to the recycling chamber.

3. The feeding apparatus of claim 2, wherein a bottom of the recycling chamber further comprises a component through-hole to communicate with the component guiding channel.

4. The feeding apparatus of claim 1, wherein at least one of the first sifting unit and the second sifting unit comprises a mechanism for identifying the position of components.

5. The feeding apparatus of claim 4, wherein the mechanism for identifying the position of components further comprises a photoelectric sensor or an image identifying apparatus.

6. The feeding apparatus of claim 1, further comprising a base for supporting the vibrating tray feeder module, the vibrating linear feeder module, and the component recycling module, wherein the base is height-adjustable.

7. A surface mount system for performing a surface mount process on a plurality of components, comprising:
    a feeding apparatus comprising:
        a vibrating tray feeder module having a circular vibrating conveyer belt, wherein the circular vibrating conveyer belt has a vibrating tray output end;
        a vibrating linear feeder module having a linear vibrating conveyer belt, wherein the linear vibrating conveyer belt is connected to the vibrating tray output end and has a linear vibrating output end opposite the vibrating tray output end; and
        a component recycling module disposed under the vibrating tray feeder module to recycle a portion of the components rejected by the vibrating tray feeder module; and
    a surface mount apparatus having a component receiving unit corresponding to the linear vibrating output end of the vibrating linear feeder module.

8. The surface mount system of claim 7, wherein the vibrating tray feeder module comprises at least one first sifting unit, the first sifting unit is disposed on the circular vibrating conveyer belt and is located at upstream of the vibrating tray output end.

9. The surface mount system of claim 7, wherein the vibrating linear feeder module comprises at least one second sifting unit, the second sifting unit is disposed on the linear vibrating conveyer belt and is located near the vibrating tray output end.

10. The surface mount system of claim 7, wherein the component recycling module further comprises a recycling chamber and a component guiding channel, the recycling chamber is disposed under the vibrating tray feeder module while the component guiding channel extends underneath the second sifting unit and delivers the components to the recycling chamber.

11. The surface mount system of claim 7, wherein a bottom of the recycling chamber further comprises a component through-hole to communicate with the component guiding channel.

12. The surface mount system of claim 8, wherein the first sifting unit comprises a mechanism for identifying the position of components.

13. The surface mount system of claim 9, wherein the second sifting unit comprises a mechanism for identifying the position of components.

14. The surface mount system of claim 12, wherein the mechanism for identifying the position of components comprises a photoelectric sensor or an image identifying apparatus.

15. The surface mount system of claim 13, wherein the mechanism for identifying the position of components comprises a photoelectric sensor or an image identifying apparatus.

16. The surface mount system of claim 7, further comprising a base for supporting the feeding apparatus, wherein a height of the base is adjustable to allow the height of the linear vibrating output end to correspond to the height of the component receiving unit of the surface mount apparatus.

17. The surface mount system of claim 7, wherein the linear vibrating conveyer belt has a feeding speed, the component receiving unit has a receiving speed, the feeding speed is greater than the receiving speed.

18. The surface mount system of claim 7, wherein the linear vibrating conveyer belt has a feeding speed, the component receiving unit has a receiving speed, when the feeding speed is smaller than the receiving speed, the surface mount system includes a plurality of the feeding apparatus, so that a sum of the feeding speed of the linear vibrating conveyer belts of the feeding apparatuses is greater than the receiving speed of the component receiving unit.

19. The surface mount system of claim 7, wherein the component receiving unit includes a detector for sensing the transport status of the components on the linear vibrating output end, the component receiving unit is actuated to receive the components according to the transport status.

20. The surface mount system of claim 19, wherein the detector can be a vacuum sensing system, a photoelectric sensing system, or a sensing apparatus capable of identifying the presence of components.

\* \* \* \* \*